United States Patent [19]

Bravenec

[11] Patent Number: 4,479,383
[45] Date of Patent: Oct. 30, 1984

[54] BOREHOLE APPARATUS FOR THERMAL EQUALIZATION

[75] Inventor: Frank R. Bravenec, Houston, Tex.
[73] Assignee: Halliburton Company, Duncan, Okla.
[21] Appl. No.: 389,659
[22] Filed: Jun. 18, 1982
[51] Int. Cl.³ .............................................. E21B 47/00
[52] U.S. Cl. .......................................... 73/151; 73/431
[58] Field of Search ................. 73/151, 154, 152, 431; 374/208

[56] References Cited

U.S. PATENT DOCUMENTS 4,302,886 12/1981 Starr ................................... 73/431 X
4,430,691 2/1984 Rea ................................... 374/208 X

*Primary Examiner*—Jerry W. Myracle
*Attorney, Agent, or Firm*—W. J. Beard

[57] ABSTRACT

A system is disclosed for use in packaging electronic systems for use in high temperature well boreholes. A fluid tight hollow body member or sonde is provided having unique longitudinally extensive hollow support and mounting members for electronic components. The hollow interior of the support and mounting members contain a bismuth eutectic alloy heat absorbant material for evenly distributing heat developed in the electronic componentry throughout the logging tool.

10 Claims, 4 Drawing Figures

SMALL DIA. TOOLS

LARGE DIA. TOOLS

BOREHOLE APPARATUS FOR THERMAL EQUALIZATION

BACKGROUND OF THE INVENTION

The present invention concerns apparatus for use in a well logging environment, and more particularly, with such apparatus for use in high or elevated temperature environments in a borehole in earth formations.

Generally speaking in recent years, wells have been drilled to greater and greater depths to reach petroleum or hydrocarbon deposits than in the past. Because of the greater depths to which wells have been drilled, higher temperature formations and high borehole temperatures have been encountered. Also in recent years, interest in so-called geothermal wells has increased substantially. The geothermal wells embody wells into which high temperature steam generated in the earth's crust is transported to the surface for use in driving electrical generators or the like. In general, geothermal wells have a higher temperature than would be encountered in a hydrocarbon producing well at the same depth. Because of the substantially higher temperatures encountered in deeper hydrocarbon producing wells and in geothermal wells, well logging service companies have been called upon to provide electronically powered and controlled well logging tools which operate at increasingly higher temperature and more hostile environments than in the past.

The construction of electronic measurement systems for well logging use at higher temperature ranges has typically followed two paths. The first path has been to design electronic circuits using higher temperature rated components than were previously used. Unfortunately, the higher the temperature rating requirement on electronic components, the fewer the number of commercially available components. Thus, the circuit design becomes limited by the available variety of parts having high temperature ratings rather than by the design concepts for the electronic circuits. The second path which has been followed is to design circuits which have limited temperature ratings and then to package these circuits within an environment capable of protecting them from the elevated temperatures encountered in operation. For example, such packaging techniques have included the use of an insulated vacuum flask similar to a conventional thermos bottle. Such systems have included within the flask a material for heat absorption from the electronically powered circuits contained in the thermos or vacuum flask. Typically a material used for this purpose has been a bismuth alloy of a nature eutectic which changes phase from solid to liquid at approximately 281° F. and in this phase change, absorbs a substantial amount of heat energy according to its specific heat of fusion. A eutectic alloy has a melting temperature which coincides with its freezing temperature, thus having no freezing range between its solid and liquid states. A typical alloy suitable for such use is "Cerrotru (®)" (registered trademark of the Cerro Corp. of New York, N.Y.). This alloy has a latent heat of fusion 20 BTU/LB. and comprises an alloy of about 58% bismuth and 42 percent tin.

In high temperature logging operations beginning at a surface ambient temperature, a well logging tool is rapidly lowered into a high temperature region of the borehole and logging measurements are made as rapidly as possible. As the temperature within the electronic package rises due to external heat flow and the internal power dissipation of the electronic components, the temperature within the package can be somewhat limited or modified by the heat absorbant alloy material. This process works until all the alloy has changed phase from a solid to a liquid employing its latent heat of fusion. The maximum time that the well logging instrument may remain in the hostile temperature environment is thus limited by the amount of heat absorbant material available and additionally by the efficiency of placement of the heat absorbant material to absorb heat from the electronic componentry which generates internal heat due to its consumption of electrical power.

In typical construction schemes used in the prior art the heat absorbing material has been placed in a vacuum flask adjacent electronic circuit components. Typically such placement has been at one end of the vacuum flask, the remainder of the flask being employed to contain the electronic circuit modules. In such construction techniques, the heat transfer mechanism throughout the vacuum flask is restricted by the packaging system. Flow of air across the electronic components is virtually nonexistent due to transverse wafers which are reinforcing members used to support the electronic circuitry and to reinforce the internal walls of the vacuum flask. The temperature between individual spacers or modules of the electronic componentry may rise considerably above the temperature of the heat absorptant material situated at one end of the vacuum flask due to high power dissipation in some electronic components. Primarily heat transfer by conduction through metallic members is relied upon, since there is very poor air circulation to conduct the heat from the components generating power dissipation to the heat absorbant material within the vacuum flask. Moreover, the entire length of the vacuum flask, and hence the well logging tool, utilizing such a packaging system must be increased approximately 50 percent under prior art conditions, in order to provide space for the heat absorbent material within the instrument housing. For example, there must be approximately 12 inches of heat absorbing material for each 24 inches of circuit components when placed end to end in the manner known in the prior art. The heat absorber thus increases the length requirement of the well logging instrument housing by approximately 50 percent.

BRIEF DESCRIPTION OF THE INVENTION

In the present invention a new electronic packaging system and several embodiments thereof are provided which eliminates or substantially reduces problems existing in prior art packaging schemes for use in well logging instruments in hostile temperature environments. In the present invention, a heat absorbant material is used to maintain an approximately constant internal temperature in a vacuum flask or well logging instrument housing. The heat absorbant material is distributed throughout the entire instrument housing in a more less uniform manner by unique structural members which employ internal spaces for the heat absorbant material therein. This is directly contrasted with prior art techniques in which the heat absorbant material is situated separately and entirely connected to the electronic circuitry components by structural members supplying heat conduction means. Moreover, in the packaging systems of the present invention direct physical contact may be obtained between high power or high heat dissipation components and the heat absorbing material. In most cases packaging members maybe obtained with the heat absorber included therein which are no more lengthy than the original package without a heat absorber would be. Several different embodiments of electronic structural member packaging systems employing the concepts of the present invention are disclosed herein.

BRIEF DESCRIPTION OF THE DRAWINGS

The above recited features and advantages of the present invention will be understood with more particularity by reference to the accompanying drawings which are intended to be illustrative only and not limitative. These drawings include.

DESCRIPTION OF THE PREFERRED EMBODIMENTS

Figure 1:
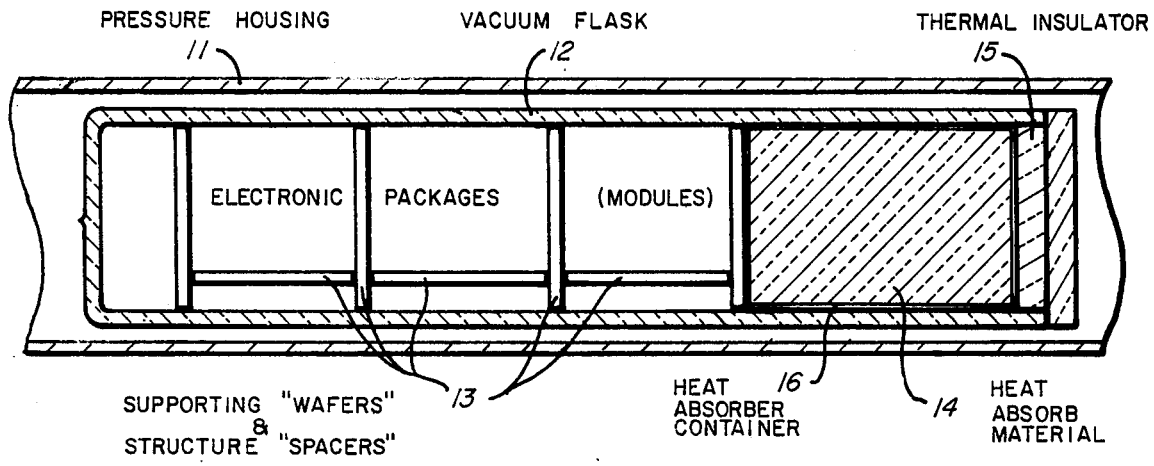
FIG. 1 which illustrates schematically in a longitudinal section view a packaging technique according to the prior art.

Referring initially to FIG. 1 an electronic packaging scheme is shown in longitudinal cross-section view which has been used in prior art high temperature well logging instruments. An outer pressure housing 11 comprising a hollow fluid tight tool case contains an inner vaccum flask 12 of conventional design. The vacuum flask 12 has a double wall thickness with a vacuum between the two walls and is closed off at the left-end thereof as illustrated in FIG. 1. The flask 12 sealed with a thermal insulating material 15 at the opposite end thereof. The vacuum flask 12 contains, at one end thereof, electronic modules and supporting wafers or spacers 13 for supporting circuit board members of the electronic componentry. The support wafers and structure 13 is in physical contact with a heat absorbing material 14 which may comprise for example a bismuth eutectic alloy, as previously discussed, having a high latent heat of fusion which remains in a solid material configuration phase until a temperature of approximately 281° F. is reached at atmospheric pressure. The heat absorbant material 14 is held in a sealed container 16. During the logging operation heat developed in the electronic componentry is conducted along the support structure members and spacers 13 and brought into physical contact by conduction primarily with the container 16 and heat absorbing material 14. Thus as long as the heat absorbing material 14 remains in its solid phase an approximately constant temperature distribution is maintained in the electronic packaging scheme so long as the heat conduction of the support structure and spacers 13 is adequate to provide good heat transfer to the heat absorbing material 14.

It will be readily appreciated from the illustration of FIG. 1 that little or no convective cooling is provided by this scheme because of the lack of air flow available in the packaging technique used within the vacuum flask. Thus it is possible for "hot spots" to occur among the electronic modules due to the increased power dissipation of some components in the electronic circuitry over others.

Figure 2A:
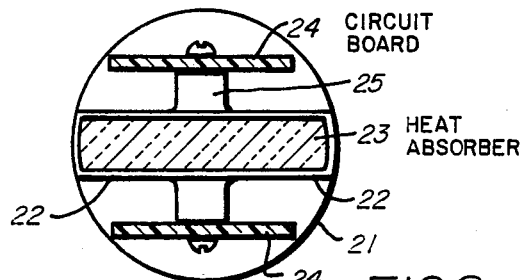
FIG. 2 which illustrates in transverse cross-sectional view two embodiments of a heat absorbing packaging member for use in small diameter well well logging instruments according to the present invention.
Figure 2B:
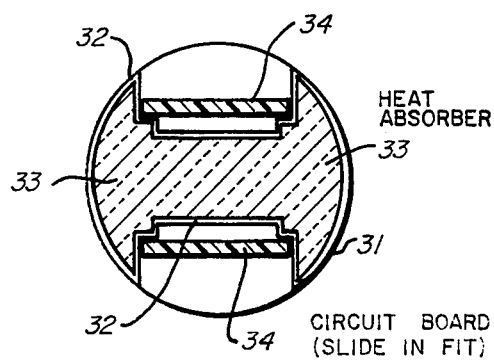

Referring now to FIG. 2, two embodiments of heat absorbant packaging for electronic componentary according to the concepts of the present invention are illustrated schematically in transverse cross section view. In the upper illustration in FIG. 2, the inner circumference of the outer container (pressure housing or vacuum flask) is illustrated by the circle 21. A hollow structural member having a generally rectangular cross-section 22 is shown in cross-sectional view. The hollow member 22 has its outer shell 22 comprising a metal surface such as a light weight aluminum alloy which is a good conductor of heat. The interior of the structural member 22 may be filled with a heat absorbant material 23 which may be of the bismuth eutectic alloy type previously discussed. Circuit boards 24 are affixed to the outer metallic shell of the hollow structural member 22, by conventional mounting means 25 such as threaded receptacles for receiving bolts or screws passed through these circuit boards 24.

In the embodiment shown in the lower schematic transverse cross-sectional view of FIG. 2, the circle 31 represents the inner circumference of the outer pressure housing or vacuum flask of a well logging tool and a convex shaped structural support member 32 having a hollow interior filled with a heat absorbent material 33 is illustrated. Circuit boards 34 are slideably and snuggly fit into the opening or recess provided in the structural support member 32. The member 32 is filled with the heat absorbant material 33 which may be of the type previously described.

It will be appreciated by those skilled in the art that the hollow structural members 22 and 32 shown in transverse cross-section in FIG. 2 may be produced by extrusion of an aluminum alloy or may be produced in two separate symmetrical pieces by stamping processes and then joined together as by spot welding, riveting or bolting to provide the hollow structures illustrated in FIG. 2. In either case, the circuit boards 24 and 34 containing the electronic componentry are co-extensive longitudinally along the tool body with the hollow structural support members 22 and 32 and are in intimate electrical and thermal contact therewith along the entire length of these circuit boards. This arrangement distributes the heat absorbing material 23 and 33 along the entire length of the circuit board in good thermal contact therewith. This construction provides much more readily for good heat transfer capability from the circuit boards to the heat absorbing material carried inside the hollow structural members 22 and 32.

Figure 3:
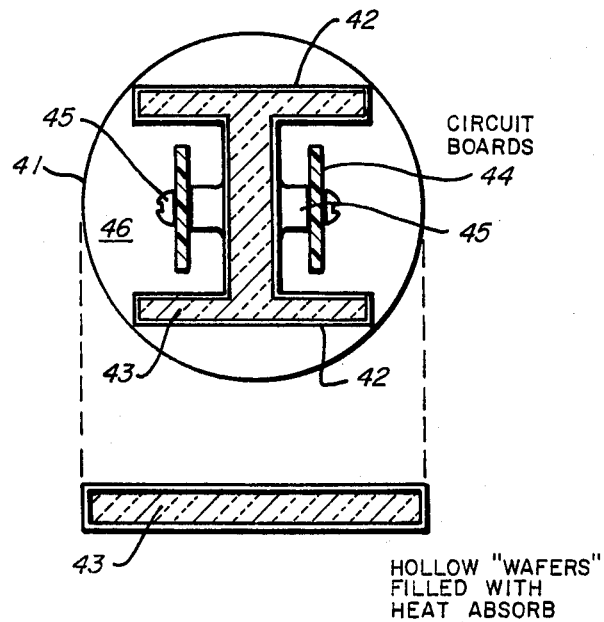
FIG. 3 which illustrates in transverse cross sectional view yet another packaging structural member concept according to the present invention, for use in larger diameter well logging instruments.
Figure 4:
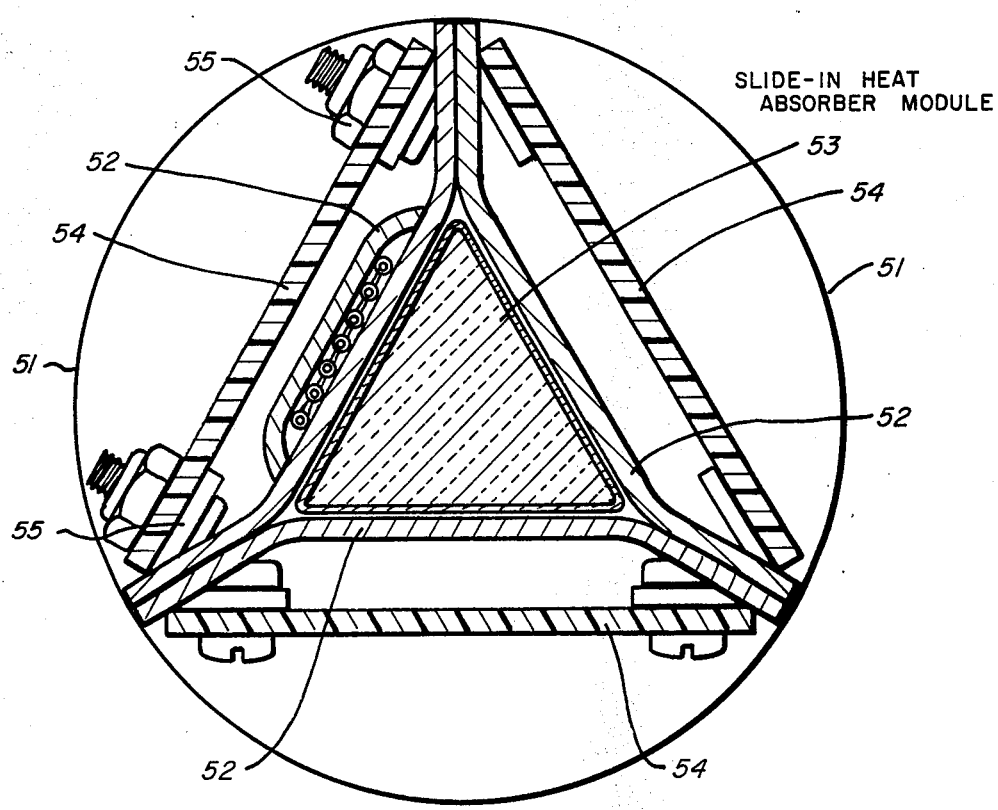
FIG. 4 which illustrates schematically in transverse cross sectional view a high density packaging technique for structural members in a well logging instrument for down hole use.

Referring now to FIG. 3 an alternate embodiment comprising a hollow I beam structure which is similarly filled with a heat absorbing material is shown in transverse cross-sectional view. Also shown in a cross-sectional end-view in the lower portion of FIG. 3 is a hollow wafer or spacer which is also filled with heat absorbant material and which may structurally add to the support of the outer pressure resistant housing or vacuum flask. In FIG. 4, the circle 41 represents the inner circumference of the well logging tool pressure housing or the vacuum flask as previously discussed. An I beam structural member 42 is provided which runs longitudinally along the length of the well logging instrument and which has a hollow interior which is filled with a heat absorbant material 43 which may be of the bismuth eutectic alloy type previously described. Transverse spacer or bulk head structure 46 is shown in cross-sectional view of the lower portion of FIG. 3. This bulk head or spacer 46 may similarly be filled with the heat absorbant material 43. Circuit boards 44 are mounted within the sides of the I beam support member 42 by conventional mounting means 45 as illustrated. Again the circuit boards 44 are in intimate thermal contact along their entire length with the hollow heat absorbant filled structural member 42. They may similarly be in intimate thermal contact the bulk head or spacer members 46 which are also filled with the heat absorbant alloy material. Again the hollow I beam structure illustrated in FIG. 3 may be formed by the extrusion of an aluminum alloy material or may be formed in two pieces by stamping processes and then joined together by such means as spot welding in order to produce the hollow structural member 42 as illustrated in FIG. 3.

Referring now to FIG. 4 a high density electronic packaging system utilizing the heat absorbing material principles of the present invention is illustrated in transverse cross-sectional view. In FIG. 4 the circle 51 represents the interior circumference of the outer pressure housing or vacuum flask of the well logging tool as previously discussed. A flanged triangularly cross-sectioned longitudinally extensive support member 52 having a hollow interior portion filled with a heat absorbing material 53 on its interior walls is shown in FIG. 4. Circuit boards 54 may be mounted along each of the three sides of the interior triangular shaped portion of the support member 52 as shown. This packaging technique permits the use of an additional circuit board which may run longitudinally along the entire length of the logging tool and hence provides greater electronic density of packaging than the embodiments shown in FIG. 2 and FIG. 3.

The circuit boards 54 of FIG. 4 are attached to the center support member structure 52 by conventional mounting means 55 affixed to tabs which may be, for example, punched at intervals along the support member 52 length and bent outwardly therefrom. It will be noted that in the embodiment shown in FIG. 4 of the support member structure that the circuit boards 54 are in intimate electrical and thermal contact with the walls of the support member 52 along their entire length. The heat load from each of the circuit boards 54 may thus be readily conducted through the mounting means to the structural support member 52. The hollow interior portion of the structural support member 52 is provided with "slide in" or insertable heat absorber modules 53 which may be inserted longitudinally along the axis of the support member 52 as desired. Non-heat absorbing spacers may be utilized, if desired, along portions of the structure 52 which do not carry electronic component mounted on the circuit boards 54.

It will be observed that in all of the embodiments shown in FIGS. 2, 3 and 4 of the present invention, that the concept of distributing the heat absorbing material along the entire length of the circuit boards or electronic components is utilized. Because of this geometrial arrangement, the length of the electronic componentry may be reduced substantially from that shown in the prior art technique illustrated in FIG. 1. Moreover, the support member structures shown in FIGS. 2, 3 and 4 provide much better thermal contact with each electronic module in the well logging instrument thereby providing much better thermal equalization of temperature throughout the instrument housing.

The foregoing descriptions may make other operable alternative embodiments apparent to those skilled in the art. Accordingly, it is the aim of the appended claims to cover all such embodiments as fall within the true spirit and scope of the invention.

I claim:

1. Well logging apparatus for use in high temperature boreholes in earth formations, comprising:
a fluid tight hollow body member sized and adapted for passage through a well borehole, said body member housing interiorly thereto a longitudinally extensive support and mounting member for mounting electrical components thereon, said support and mounting member having a hollow interior construction and containing a heat absorbant material approximately uniformly distributed along its longitudinal length, thereby providing an approximately uniform heat absorbing capability along the length of said support and mounting member for absorbing heat from electrical components in said apparatus.

2. The apparatus of claim 1 wherein said heat absorbant material comprises a bismuth eutectic alloy.

3. The apparatus of claim 2 wherein said heat absorbant material completely fills the interior of said support and mounting member.

4. The apparatus of claim 2 wherein said support and mounting member has a generally rectangular transverse cross section.

5. The apparatus of claim 2 wherein said support and mounting member has a generally triangular transverse cross section.

6. The apparatus of claim 2 wherein said support and mounting member has a generally I shaped transverse cross section.

7. The apparatus of claim 2 and further including vacuum flask means carried interior to said fluid tight hollow body member, said support and mounting member being sized and adapted to be carried interior to said vacuum flask means.

8. The apparatus of claim 7 wherein said support and mounting member has a generally rectangular transverse cross section.

9. The apparatus of claim 7 wherein said support and mounting member has a generally triangular shaped transverse cross section.

10. The apparatus of claim 7 wherein said support and mounting member has a generally I shaped transverse cross section.

* * * * *